US009004708B2

(12) United States Patent
Hayden, Sr. et al.

(10) Patent No.: US 9,004,708 B2
(45) Date of Patent: *Apr. 14, 2015

(54) VIEWING ANGLE SYSTEM FOR BACKLIGHTED DISPLAYS

(71) Applicant: Cisco Technology, Inc., San Jose, CA (US)

(72) Inventors: Perry L. Hayden, Sr., Salinas, CA (US); Ronald D. Lutz, Jr., Round Rock, TX (US); Charles Ingalz, San Jose, CA (US); Bill Hin Yi Fong, Sacramento, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/053,371

(22) Filed: Oct. 14, 2013

(65) Prior Publication Data

US 2014/0036478 A1 Feb. 6, 2014

Related U.S. Application Data

(63) Continuation of application No. 13/301,352, filed on Nov. 21, 2011, now Pat. No. 8,585,228.

(51) Int. Cl.
| | |
|---|---|
| *F21V 7/04* | (2006.01) |
| *F21V 33/00* | (2006.01) |
| *G06F 1/18* | (2006.01) |
| *H05K 7/14* | (2006.01) |
| *F21V 8/00* | (2006.01) |

(52) U.S. Cl.
CPC ............ *F21V 33/0052* (2013.01); *G02B 6/0018* (2013.01); *G06F 1/181* (2013.01); *H05K 7/1494* (2013.01)

(58) Field of Classification Search
USPC .............. 362/97.1, 97.2, 97.3, 620, 624, 558
See application file for complete search history.

(56) References Cited

U.S. PATENT DOCUMENTS

| | | | |
|---|---|---|---|
| 5,225,818 A | 7/1993 | Lee et al. | |
| 5,618,096 A | 4/1997 | Parker et al. | |
| 6,307,527 B1 | 10/2001 | Youngquist et al. | |
| 6,686,847 B1 | 2/2004 | Mittler | |
| 6,714,185 B2 * | 3/2004 | Kim et al. | 345/102 |
| 7,176,885 B2 | 2/2007 | Troxell et al. | |
| 7,712,933 B2 | 5/2010 | Fleischmann et al. | |
| 7,903,194 B2 | 3/2011 | Epstein et al. | |
| 8,585,228 B2 * | 11/2013 | Hayden et al. | 362/97.1 |
| 2006/0044286 A1 * | 3/2006 | Kohlhaas et al. | 345/173 |
| 2007/0247872 A1 * | 10/2007 | Lee et al. | 362/616 |
| 2008/0030449 A1 | 2/2008 | Lee et al. | |
| 2009/0268434 A1 | 10/2009 | Mita et al. | |
| 2010/0283933 A1 | 11/2010 | Schaeffer et al. | |

\* cited by examiner

*Primary Examiner* — Ali Alavi

(57) ABSTRACT

An apparatus to widen the light dispersion pattern of a light source shining through an overlay window from the viewing side of an electrical computer system. The overlay window is coupled to a panel of the system. The overlay window includes a transparent material, which has a first surface facing the light source and a second surface facing away from the light source to define a viewing side. An opaque material can be disposed on the first surface to partially cover the first surface to form a viewing window. A first diffusing mechanism is disposed on the first surface, and a second diffusing mechanism is disposed on the second surface. In response to the passage of the light output through the viewing window, the light dispersion pattern of the light output from the viewing side of the overlay window has a viewing angle of up to about 180 degrees.

20 Claims, 5 Drawing Sheets

VIEWING ANGLE SYSTEM FOR BACKLIGHTED DISPLAYS

CROSS-REFERENCE TO RELATED APPLICATIONS

This application is a continuation application of U.S. patent application Ser. No. 13/301,352 filed Nov. 21, 2011, which is hereby incorporated by reference to its entirety herein.

FIELD

The present disclosure relates to backlighted displays, and in particular, to backlighted displays with an increased viewing angle from the viewing side of the panel.

BACKGROUND

Displays have a clear window to allow light transmission from a light source for customer identification of activity. For example, the light source can be a light pipe, which is a clear plastic part that conveys light indirectly from one source location to another, or directly from a light emitting diode (LED) source. In the context of electronic equipment, manufacturers commonly use LEDs mounted on circuit boards to transmit light to front panels or faceplates through display windows that are viewable by users of the electronic equipment. Accordingly, the manufacturers can enable the users to obtain useful visual information directly from the LEDs of the circuit boards even if the LEDs are nestled deeply behind the front panels or faceplates.

The problem is that the LED can be mounted a considerable distance from the back of the display window, such that at certain viewing angles from the front of the display window, the LED becomes less visible or appears to have shadows. For instance, when the end user is looking at the display window from the side (i.e., not dead on) within blind spots of the light or about 45 degrees relative to the planar surface, the visual information about the system will not be apparent to the end user. Shadowing at the display window can reduce the effective area of the display window and make alphanumeric elements or logos or designs less appreciable. It has been conventional to overcome the shadowing aspects by shortening the distance between the LED and display window, which reduces the viewing angle. In addition, it has been conventional to use a light source larger than the display window, which is a more expensive component to procure and operate and takes additional space within the electronic component. Furthermore, light pipe configurations are problematic because a light pipe is easily mounted out of alignment. In addition, the light pipe provides an unbalanced intensity throughout the light pipe because of the poor internal reflection of the light pipe along the light pipe path. Furthermore, the light pipe is mounted extremely close to the display window (e.g., about 0.020 inches), and is typically sized much larger than the display window to avoid shadowing.

Thus, there remains a need for a system having a display window backlighted with a light source, which has a wider viewing angle so the end user can obtain useful visual information about the system from the light source from the sides of the front panel or faceplate. It would be desirable to provide a display window with a more evenly distributed light across the window and/or with reduced shadowing.

BRIEF DESCRIPTION OF THE DRAWINGS

The components and the figures are not necessarily to scale, emphasis instead being placed upon illustrating the principles of the example embodiments. Moreover, in the figures, like-referenced numerals designate corresponding parts throughout the different views.

DETAILED DESCRIPTION OF THE DRAWINGS

Overview

Figure 1:
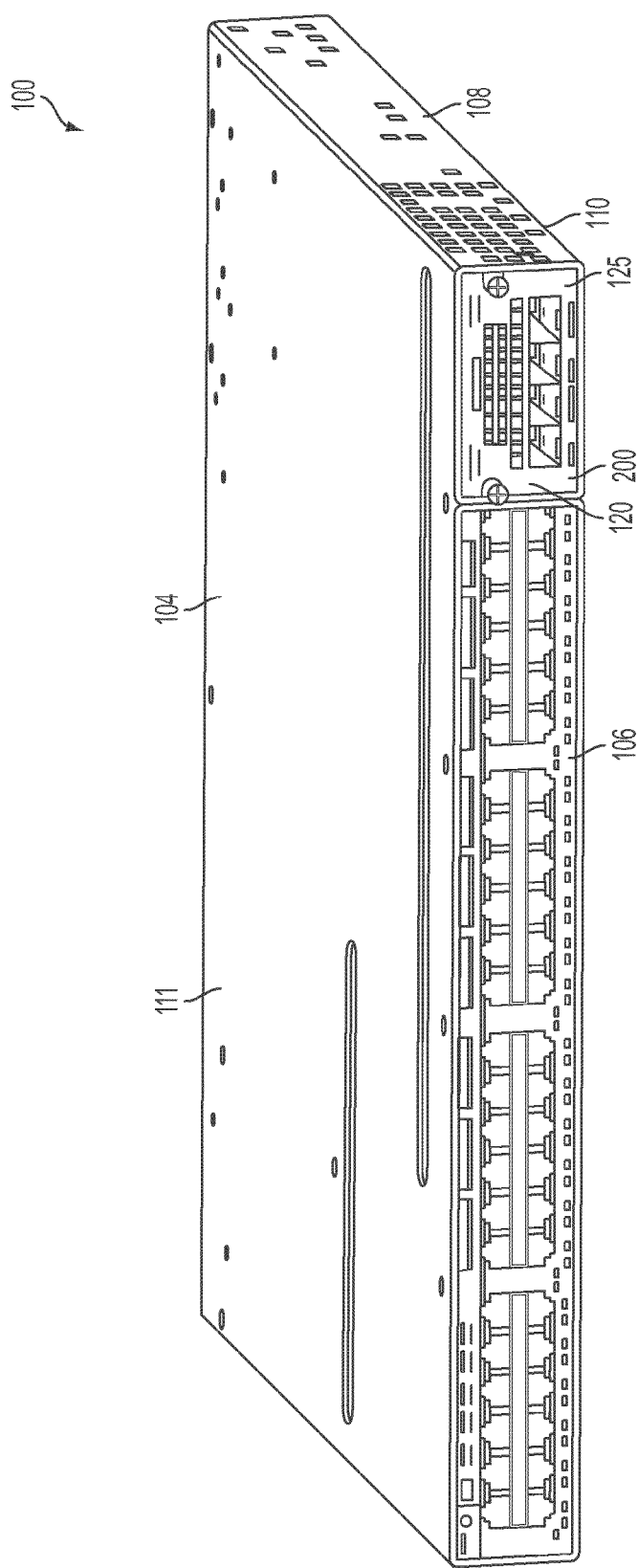
FIG. 1 is a perspective view of one embodiment of an electronic computer system.

In one embodiment, an apparatus may include an electronic computer system having a panel. The apparatus also may include a light source configured to generate a light output. An overlay window may be coupled to the panel of the electronic computer system. The overlay window may include a transparent material having a first surface facing the light source and a second surface facing away from the light source to define a viewing side of the overlay window. An opaque material may be disposed on the first surface. The opaque material may partially cover the first surface to define an uncovered surface area forming a viewing window. A first diffusing mechanism may be disposed on the first surface along the uncovered surface area. A second diffusing mechanism may be disposed on a portion of the second surface corresponding to the viewing window. The light output may have a first dispersion angle at the first surface of the overlay window and a wider dispersion angle at the second surface of the overlay window so that a viewing angle of the light output from the viewing side of the overlay window is up to about 180 degrees.

In another embodiment, a system may include an electronic computer system having a panel. The system also may include a light source configured to generate a light output having a first dispersion angle. An overlay window may be coupled to the panel of the system. The overlay window may include a transparent material. The transparent material may have a first surface facing the light source and a second surface facing away from the light source to define a viewing side of the overlay window. A translucent ink may be disposed on the first surface along a region of the overlay window defining a viewing window. A plurality of surface irregularities may be formed in a portion of the second surface corresponding to the viewing window. In response to the passage of the light output through the viewing window, a viewing angle of the light output from the viewing side of the overlay window may be up to about 180 degrees.

In yet another embodiment, a method may include providing an electrical computer system having a panel and a light source configured to generate a light output. The method also may include providing an overlay window coupled to the panel of the system. The overlay window may include a transparent material having a first surface facing the light source and a second surface facing away from the light source to define a viewing side of the overlay window. An opaque material may be disposed on the first surface of the transparent material. The opaque material may partially cover the first surface to define an uncovered surface area forming a viewing window. A first diffusing mechanism may be disposed on the first surface along the uncovered surface area. A second diffusing mechanism may be disposed on a portion of the second surface corresponding to the viewing window. The method also may include generating a light output having a first dispersion angle toward the overlay window. The method also may include scattering the light output with the first diffusing mechanism at a second dispersion angle that is greater than the first dispersion angle. The method also may include scattering the light output with the second diffusing mechanism at a third dispersion angle that is greater than the second dispersion angle. In response to the passage of the light output through the viewing window, a viewing angle of the light output from the viewing side of the overlay window is up to about 180 degrees.

Example Embodiments

The following description generally relates to apparatus and methods for widening the light dispersion pattern of a light source through a display window of an electronic computer system to a viewing angle of up to 180 degrees. The electronic computer systems can be for a variety of industry applications, such as, e.g., telecommunication network server systems, web server systems, LAN application and file server systems, personal computer systems, and vehicle control systems.

FIG. 1 illustrates a perspective view of one embodiment of an electronic computer system. The electronic computer system can be any computer equipment such as a computer server, a router, a switch, a blade server, or any other computing device. One exemplary electronic computer system the CISCO CATALYST 3750X and 3560X switches, which are commercially available from Cisco Systems Inc. (San Jose, Calif.). The electronic computer system 100 may include a chassis 104. The chassis 104 can form a box shape with a face panel 106, a rear panel opposite the face panel, a pair of side panels 108 (only one shown), a base panel 110, and a top panel 111 opposite the base panel 110. The terms "face," "rear," "side," "base," and "top," and derivatives thereof relate to the orientation of the component as shown in the figures, and it is understood that these terms are illustrative and that the component in the figures can assume alternative orientations. The system 100 can be a rack-mounted unit for a computer server rack, which is typically sized to dimensional standards as set forth by the Electronic Industries Alliance (EIA). The EIA has defined the mounting equipment in terms of a rack unit (RU), where each RU is 44.45 mm (1.75 inches) in height and 480 mm (19 inches) or 580 mm (23 inches) in width. The system 100 includes one or more display assemblies 200 provided on one or more panels, such as the front panel 120 of an electronic module 125 as shown in FIG. 1. The display assembly 200 can be configured to provide useful visual information to an end user, e.g., about the condition or status of the system 100 or a component of the system 100, such as the module 125.

Figure 2:
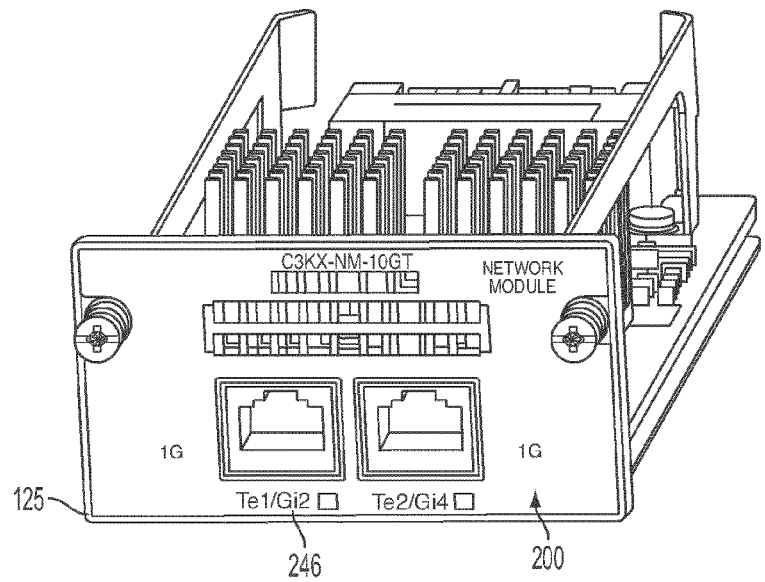
FIG. 2 is a perspective view of one embodiment of an electronic module having one example of a display assembly.
Figure 3:
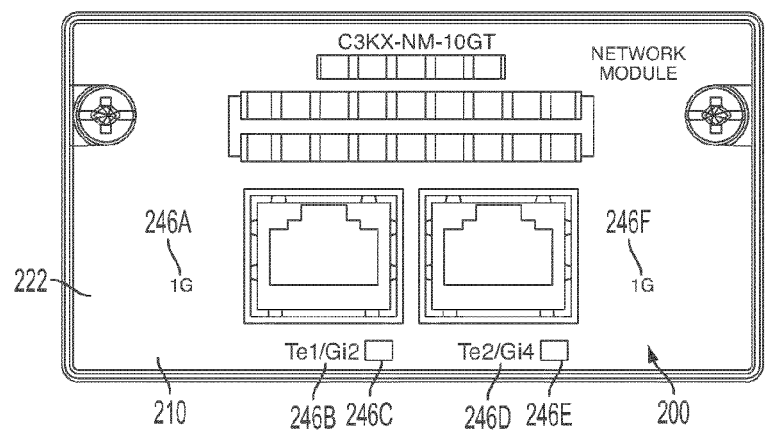
FIG. 3 is a front view of the module of FIG. 2.
Figure 4:
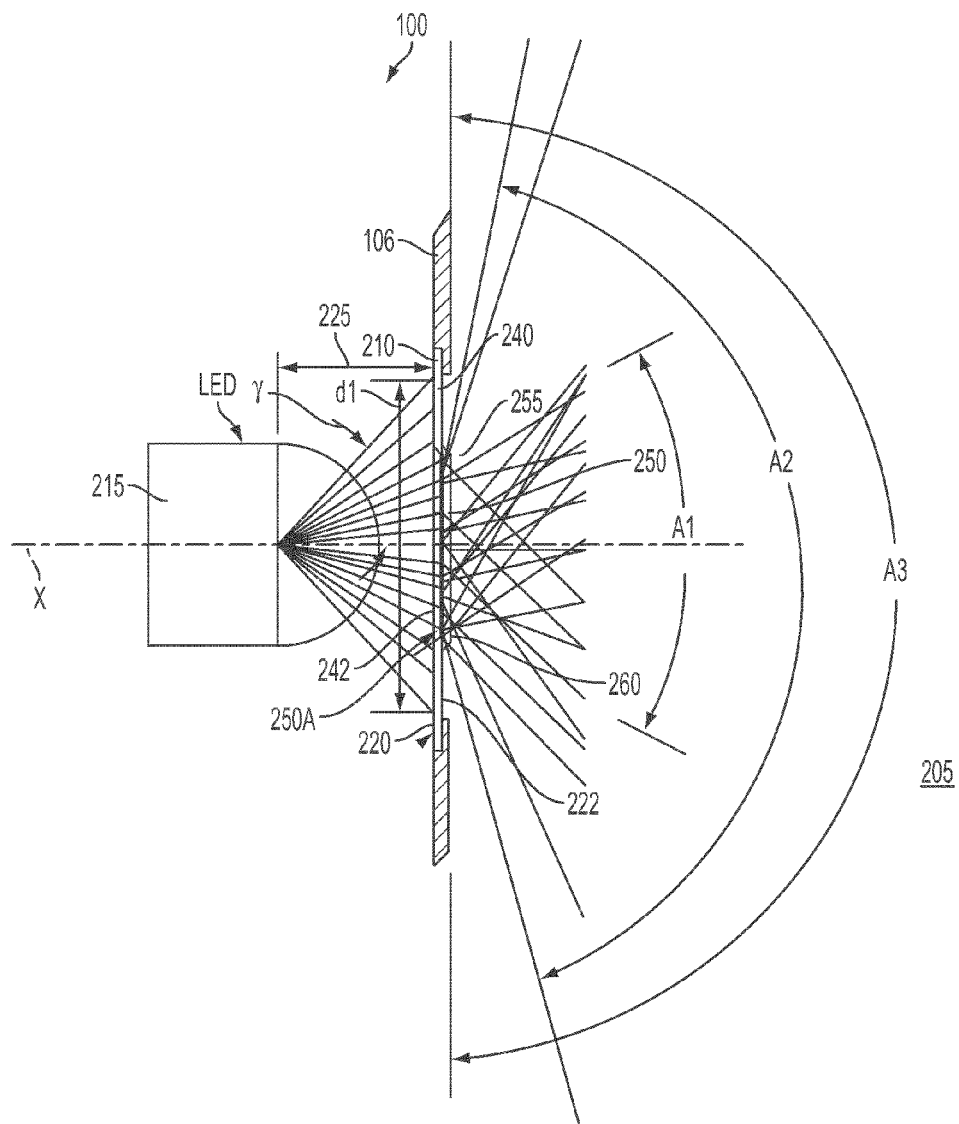
FIG. 4 is a side view of one example of a display assembly.

FIGS. 2-4 depict a close up view of the display assembly 200. The visual information provided by the display assembly 200 can be directed to a viewing side 205 that is external to the system 100. The display assembly 200 can include an overlay 210 and a light source 215. In one example, the overlay 210 is attached to a recessed area in the surface of the panel 106 such as into a bezel.

The overlay 210 can have a first surface 220 shown facing the light source 215 and a second surface 222 facing away from the light source or facing the viewing side 205. The overlay 210 can be formed from a planar sheet of a light transmitting material, having various sizes such as about 1 inch×17 inches×0.020 inches of a material, although other sizes may be used. Such light transmitting material can include a polymer such as a polycarbonate resin thermoplastic sold under the trademark LEXAN. The overlay 210 can be transparent or clear. In one example, the overlay may be tinted with a color. In one example, the overlay is a sheet of material that is about 0.020 inches thick, although the thickness can be less or more depending on the application.

In FIG. 4, the light source 215 can be provided along an axis X, which can be oriented substantially perpendicular to the overlay 210, but can vary up to about 5 degrees for manufacturing tolerances. The light source 215 can be electrically coupled to a circuit board, and is spaced by a distance 225 from the first surface 220 of the overlay 210. In one example, the distance 225 is about 1.59 mm (0.0625 inches). The light source 215 can include one or more of the following: incandescent bulbs, fluorescent bulbs, light emitting diodes (LEDs), or other types of light sources used in electronic equipment. In one example, the light source 215 is one or more LEDs. In one non-limiting example, the light source includes a LED (2.1 volt, 3 mm diameter, and a luminous intensity-green 6.3 and yellow-4.3), although other sizes, voltages, luminous intensity and colors may be used. The light source 215 provides an illumination diameter d1 at the first surface of the overlay, which can be determined by the light dispersion half-angle γ relative to the axis X and the distance 225.

In the figures, the display assembly 200 can include an opaque material 240 to substantially block light generated by the light source 215. In one example, the opaque material 240 can be disposed on the first surface 220 of the overlay 210 to partially cover the first surface 220 in a manner to define one or more areas of exposed or uncovered surface areas 242. For example, the opaque material 240 can define the border of the exposed surface area 242 in order to form a discrete viewing window 246, as shown in FIGS. 2-3, where the light source shines through. In one example, the opaque material can be applied in a manner to define the viewing window 246 with a variety of shapes, such as circular, elliptical, rectangular, or other geometric shapes. In another example, the shape of the viewing window 246 can be virtually any shape, such as the shape of a logo or trademark or letters and/or numbers. One or more viewing windows (e.g., six viewing windows shown in FIG. 3, viewing windows 246A, 246B, 246C, 246D, 246E, and 246F, which have the shapes of letters and numbers and a rectangular box) may be provided with the overlay 210. Each viewing window may be associated with a single light source such as a single LED or with more than one light source such as a series of LEDs.

The opaque material 240 can include an opaque polymer, metal, film, tissue, or coating, of one of more colors, which can be attached to a surface of the overlay 210. In one example, the opaque material includes an opaque ink that can be sprayed, dipped, brushed, silkscreened, or otherwise coated on the overlay. The opaque ink coating can have a thickness of about 0.002-0.003 inches, although the thickness can be less or more. The opaque color can be selected by the manufacturer.

The light dispersion half angle γ and the distance 225 of the light source 215 are selected to define a first illumination diameter d1. In one example, the diameter d1 can be sized larger than the viewing window 246 such that light generated by the light source 215 is transmitted at least partially to the opaque material 240. In another example, the diameter d1 may be smaller that the viewing window. To this end, the display assembly 200 generates a light dispersion pattern having a first viewing angle A1 from the viewing side 205 that is generally less than about ninety degrees when the light source 215 has the first illumination diameter d1. The light dispersion pattern with the first viewing angle A1 can be at least twice the angle of the light dispersion half-angle γ.

The display assembly 200 can include a diffusing mechanism 250 that is configured to at least partially scatter light generated by the light source 215 so that light output of the overlay 210 from the viewing side 205 has a wider light dispersion pattern. The diffusing mechanism 250 can be provided on the entire or selected areas of one or both of the first and second surfaces 220, 222 of the overlay 210. Nonlimiting examples of the diffusing mechanism 250 include one or more of the following: a paint coating or pattern, a film, an etched pattern, a machined pattern, an ink or printed coating or pattern, a hot stamped pattern, or a molded pattern. The light output of the overlay 210 from the viewing side 205 can be controlled for a desired light dispersion pattern by varying the density, opaqueness or translucence, shape, depth, color, area, index of refraction, or type of surface irregularities on one or more selected areas of the overlay surfaces.

Figure 5:
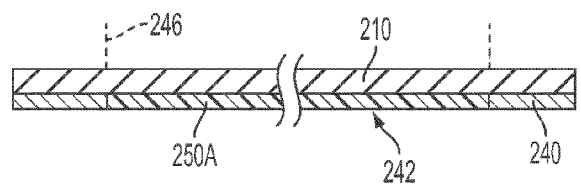
FIG. 5 is a cross-sectional view of an example overlay window.

In one example, a first diffusing mechanism 250A of the diffusing mechanism 250 can be disposed on a surface of the overlay, such as, e.g., the first surface 220 to at least partially cover the uncovered surface area 242, such as shown in FIG. 5. For example, the first diffusing mechanism 250A can cover the entire inner side of the viewing window 246 so that the surface area 242 is no longer exposed or uncovered or selected areas of the viewing window such as to form, e.g., a design or lettering. In one example, the first diffusing mechanism 250A can include a translucent polymer, film, coating, or ink. For example, the first diffusing mechanism 250A can include a translucent ink coating having a thickness of about 0.002-0.003 inches, although the thickness can be less or more to vary the diffusing effects. The ink may be applied for example by pad printing, silk screening, ink jet, or heat transfer film process or other ink processes known in the art. In one example, the first diffusing mechanism 250A such as the translucent ink can form a variety of designs, patterns, or shapes, such as letters, numbers, etc. For example, the letters can spell the name of a manufacturer, model, or other desired word(s). The translucent ink can be sized to cover the entire viewing window.

In another example, the first diffusing mechanism 250A can include a surface of the overlay 210 having surface irregularities 255 to cause the light generated by the light source 215 to scatter at a wider light dispersion pattern. For example, the surface, such as, e.g., the second surface 222, of the overlay 210 can be textured in a manner such that the surface has surface irregularities 255. At least a portion of the respective surface corresponding to the viewing window 246 can have the surface irregularities, although the entire surface may be provided with the surface irregularities. The surface irregularities 255 can provide the surface with a change in geometry such as a uniform or random pattern of low spots and/or high spots. The surface irregularities 255 can be formed by a variety of processes, such as a laser, an abrasive device such as sand paper, chemical etching, or other processes known in the art. For example, the surface irregularities 255 can be formed in accordance with a visual texture standard provided by Mold-Tech (division of Roehlen Industries), such as MT-11000 (0.0004-inch deep fine texture), MT-11010 (0.001-inch deep texture), MT-11020 (0.0015-inch deep texture), and MT-11030 (0.002-inch deep texture).

The first diffusing mechanism 250A can provide an opacity in the range of about 20% to about 80%, preferably about 50% to about 70%, and more preferably about 60%, although it can be outside the ranges if so desired. It is recognized that a lower opacity can increase the intensity, but reduce the dispersion of the light output of the light source through the overlay, and the opposite is also true where a higher opacity can reduce the intensity, but increase the dispersion. To this end, the display assembly 200 with the first diffusing mechanism 250A can generate a wider light dispersion pattern having a second viewing angle A2, larger than the first viewing angle A1, from the viewing side that is generally less than about 150 degrees to about 170 degrees when the light source 215 has the first illumination diameter d1.

Figure 6:
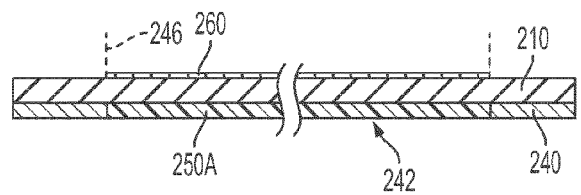
FIG. 6 is a cross-sectional view of another example of an overlay window.

In one example, the display assembly 200 can include a second diffusing mechanism 260 of the diffusing mechanism 250, in addition to the first diffusing mechanism 250A, as shown in FIG. 6. Here, the first diffusing mechanism 250A is associated with the first surface of the overlay 210 and the second diffusing mechanism 260 is associated with the second surface of the overlay 210. To this end, the first and second diffusing mechanisms 250A, 260 can be separated by the thickness of the overlay 210. The first diffusing mechanism 250A can at least partially scatter the light generated by the light source 215 at the first surface at a larger angle. The second diffusing mechanism 260 can at least partially scatter the previously scattered light from the first diffusing mechanism 250A at the second surface at even a larger angle than the first diffusing mechanism. The second diffusing mechanism can scatter the light output at the second surface of the overlay and behind the second surface for two scattering effects.

To this end, the display assembly 200 with the first and second diffusing mechanisms 250A, 260 can generate an even wider light dispersion pattern having a third viewing angle A3. The third viewing angle A3 can be larger than the first and second viewing angles A1, A2, as seen from the viewing side 205, which can be generally in the range of about 170 degrees up to about 180 degrees when the light source 215 has the first illumination diameter d1. To this end, an end user can be positioned along the panel and is capable of seeing the information conveyed by the light source, without having to be directly in front of the viewing window. This arrangement can allow the end user to view from an aisle of computer racks the status or condition of the system, rather than in front of each viewing window. It should be noted that the display assembly 200 may have different light dispersion patterns with more than one viewing angle. For example, when a first area of the overlay does not include the first diffusion mechanism, and a second area of the overlay includes the first diffusion mechanism, light through the second area will have a wider light dispersion pattern than the light through the first area. The three viewing angles, A1-A3, shown in FIG. 4 are for illustrative purposes to show the relative ranges of the viewing angles.

Figure 7:
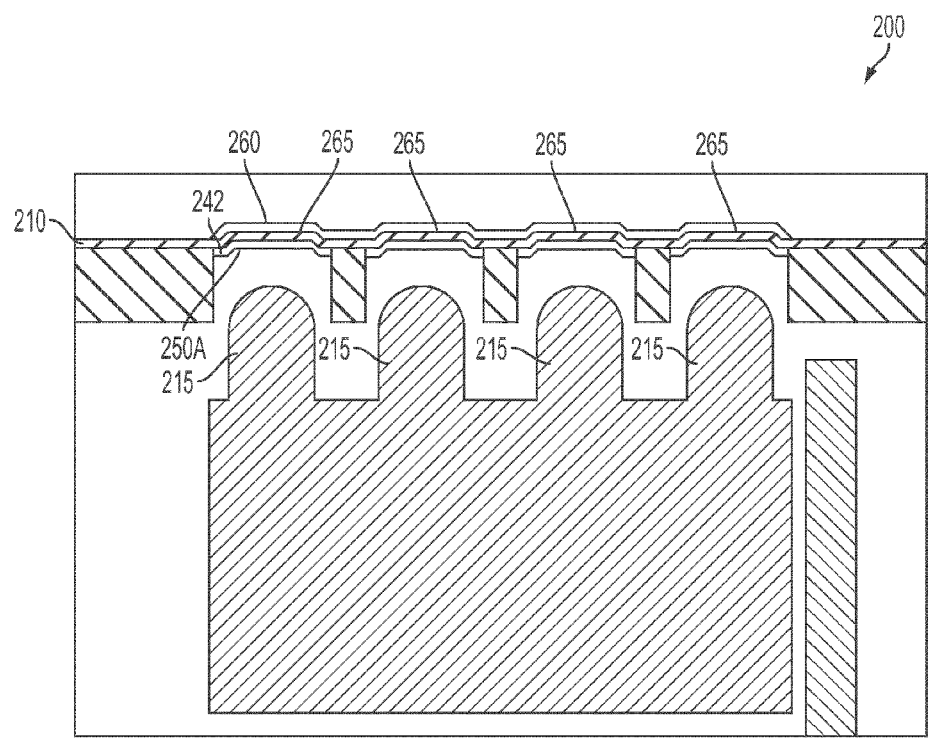
FIG. 7 is a cross-sectional view of another example of an overlay window.

In one example, the display assembly 200 may include one or more embossments 265 (four shown) to offset a portion of the overlay from the generally planar portion, as shown in FIG. 7. The embossments 265 are formed in the overlay 210 and may generally extend toward the viewing side 205, although at least one embossment may be formed to extend toward the light source. The embossments 265 may form a variety of designs, patterns, or shapes, such as letters, numbers, etc. For example, the letters can spell the name of a manufacturer, model, or other desired word(s). The embossments 265 can be formed by a variety of processes known in the art, such as with a tool and heat-vacuum formed process. In one example, the tool used for embossment may have a textured pattern thereon, such that during the embossing process, a textured surface 260 is formed on the embossments 265 of the overlay. FIG. 7 depicts an exemplary display assembly 200 having the first diffusing mechanism 250A, the second diffusing mechanism 260, and the embossment 265 applied to the overlay 210. The viewing angle for such assembly can be up to 180 degrees.

Figure 8:
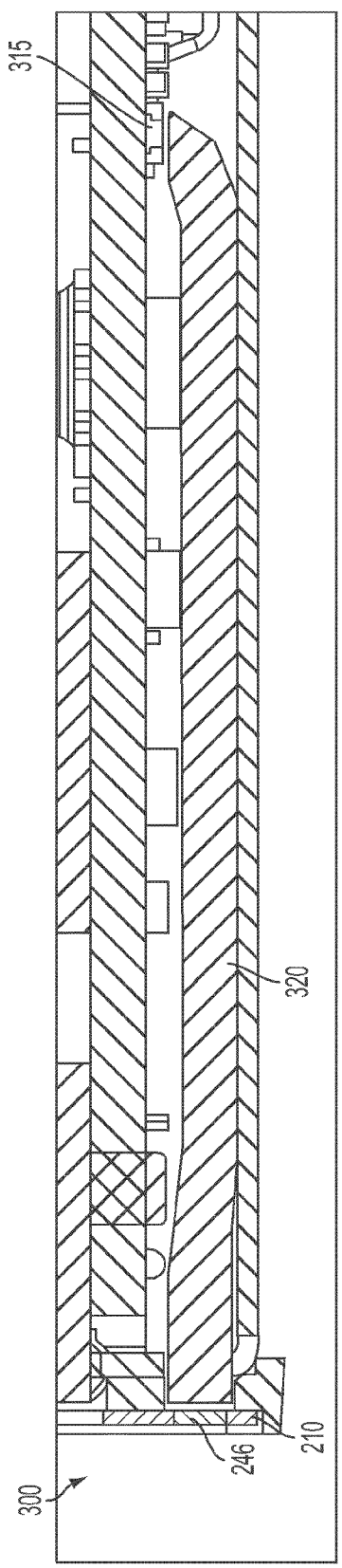
FIG. 8 is a cross-sectional view of another example of a display assembly.

FIG. 8 illustrates another display assembly 300 having a light source 315, such as a LED, and a light pipe 320. The light output from the light source is transmitted through the light pipe 320 toward the viewing window 246 formed in the overlay 210.

In one method of manufacturing, a sheet of overlay material is cut to the desired size. A first opaque ink color can be applied, such as silkscreened, to the first surface of the overlay, such as to form a logo or model number information. A second opaque ink color, different than the first ink color, such as a lighter color, can be applied, such as silkscreened, to the entire first surface of the overlay, except for those areas which are to be left exposed. For example, the second opaque ink can outline the shapes, numbers, or letters of the viewing window. A translucent ink can be applied, such as silkscreened, to exposed areas. The second surface of the overlay can be textured on the opposite sides of where the translucent ink is applied. Embossments may be formed in the overlay.

Various embodiments described herein can be used alone or in combination with one another. The foregoing detailed description has described only a few of the many possible implementations of the present invention. For this reason, this detailed description is intended by way of illustration, and not by way of limitation.

The invention claimed is:

1. An apparatus comprising:
a display assembly for an electrical module housing, the display assembly comprising:
a translucent window to display a light at a front side of the window, wherein the light is generated from a source directed to a back side of the window;
a first light diffuser on a back surface of the window, the first light diffuser operable to disperse the light at a first angle; and
a second light diffuser on a front surface of the window, the second light diffuser operable to disperse the light at a second angle greater than the first angle to provide a viewing angle of the light up to about 180 degrees at the front side of the window.

2. The apparatus of claim 1, wherein the translucent window is coupled to a panel of the display assembly, and the apparatus further comprises an opaque material applied on the back surface of the translucent window to define a discrete viewing window in a portion of the translucent window.

3. The apparatus of claim 2, wherein the translucent window comprises a planar member, at least a portion of which is mounted in a recessed area of a surface of the panel.

4. The apparatus of claim 1, wherein the translucent window forms a portion of a panel of the display assembly.

5. The apparatus of claim 1, wherein the first light diffuser comprises a translucent coating.

6. The apparatus of claim 1, wherein the second light diffuser comprises a textured surface.

7. The apparatus of claim 1, wherein the translucent window is about 50% to about 70% opaque.

8. A system comprising:
a panel configured to be mounted in an electrical module housing, the panel comprising a window to provide a light passage from a first side of the panel through the window to a second side of the panel opposite the first side;
a translucent coating applied on a first surface of the window, the first surface nearer a light generator than a second surface of the window, wherein the second surface is at the second side of the panel, wherein the translucent coating is operable to generate a first light dispersion pattern at a first viewing angle; and
a light diffuser that receives the first light dispersion pattern through the light passage and is operable to generate a second light dispersion pattern from the first light dispersion pattern, the second light dispersion pattern being generated at a second viewing angle greater than the first viewing angle, and the second viewing angle being up to about 180 degrees.

9. The system of claim 8, wherein the light diffuser is disposed on the second surface of the window to provide the second viewing angle at the second side of the panel that is up to about 180 degrees.

10. The system of claim 9, wherein the light diffuser comprises a plurality of surface irregularities on the second surface.

11. The system of claim 8, wherein the translucent coating is about 50% to about 70% opaque.

12. The system of claim 8, wherein the window further comprises a border to define a portion of the window as a discrete viewing window for the light passage.

13. The system of claim 8, wherein the border comprises an opaque material disposed on the first surface of the window.

14. The system of claim 8, wherein the window comprises embossments formed in the window extending towards the second side of the panel.

15. The system of claim 8, wherein the window comprises embossments formed in the window extending towards the first side of the panel.

16. A method comprising:
providing a panel configured for a display assembly, the panel comprising a translucent window to display a light at a front side of the window when the light is generated from a source located at a back side of the window;
dispersing the light at a first angle through a first light diffuser positioned at a back surface of the window;
dispersing the light at a second angle through a second light diffuser positioned at a front surface of the window, wherein the second angle is greater than the first angle to provide a viewing angle of the light up to about 180 degrees at the front side of the window.

17. The method of claim 16, wherein dispersing the light at the first angle through the first light diffuser comprises passing the light through a translucent coating applied onto the front surface of the window.

18. The method of claim 16, wherein dispersing the light at the second angle comprises receiving the light dispersed at the first angle and diverting the light to the second angle by filtering the light through the second light diffuser, and wherein the second light diffuser comprises a textured surface.

19. The method of claim 16, wherein the window is a planar member, at least a portion of which is mounted in a recessed portion of the panel.

20. The method of claim 16, further comprising allowing light to pass through a portion of the window comprising a discrete viewing window defined by an opaque coating applied onto the window.

* * * * *